United States Patent
Fratti

(10) Patent No.: US 7,122,892 B2
(45) Date of Patent: Oct. 17, 2006

(54) MULTI-CHIP INTEGRATED CIRCUIT MODULE FOR HIGH-FREQUENCY OPERATION

(75) Inventor: Roger A. Fratti, Mohnton, PA (US)

(73) Assignee: Agere Systems Inc., Allentown, PA (US)

(*) Notice: Subject to any disclaimer, the term of this patent is extended or adjusted under 35 U.S.C. 154(b) by 0 days.

(21) Appl. No.: 10/960,680

(22) Filed: Oct. 7, 2004

(65) Prior Publication Data
US 2006/0076676 A1 Apr. 13, 2006

(51) Int. Cl.
H01L 23/34 (2006.01)
(52) U.S. Cl. .................. 257/728; 257/678; 257/666
(58) Field of Classification Search .............. None
See application file for complete search history.

(56) References Cited

U.S. PATENT DOCUMENTS

| | | | |
|---|---|---|---|
| 4,801,765 A | 1/1989 | Moyer et al. ............. | 174/52.5 |
| RE36,894 E | 10/2000 | Greenberg et al. ......... | 361/723 |
| 6,437,449 B1* | 8/2002 | Foster ..................... | 257/777 |
| 6,700,206 B1* | 3/2004 | Kinsman .................. | 257/777 |
| 6,879,037 B1* | 4/2005 | Wada et al. .............. | 257/723 |
| 2004/0113254 A1* | 6/2004 | Karnezos ................. | 257/686 |

OTHER PUBLICATIONS

Leroys Engineering Website: IC Pack Types, Logic Design Information, found at http://interfacebus.com;Design_Pack_types.html, pp. 1-3 (Sep. 29, 2004).

* cited by examiner

Primary Examiner—Andy Huynh
Assistant Examiner—Hoang-Quan Ho

(57) ABSTRACT

A multi-chip electronic module comprises a multiplicity of integrated circuit chips arranged in a vertical stack. Each chip includes at least one first electrical terminal, with at least a first subset of the first terminals being disposed at different heights relative to the stack. A multiplicity of second electrical terminals is disposed on a support member, and a multiplicity of first electrical conductors (e.g., wirebonds) is connected between the first subset and at least a second subset of the second terminals. In order to reduce the skew produced at relatively high frequencies, all of the first conductors have substantially the same inductive impedance at the frequency of operation of the module. Our invention is particularly well suited to modules that operate at frequencies of about 500 MHz or higher.

11 Claims, 3 Drawing Sheets

MULTI-CHIP INTEGRATED CIRCUIT MODULE FOR HIGH-FREQUENCY OPERATION

BACKGROUND OF THE INVENTION

1. Field of the Invention

This invention relates to integrated circuit (IC) chips and, more particularly, to multi-chip modules for high-frequency operation.

2. Discussion of the Related Art

In the IC industry it is common to mount IC chips on a lead frame 10 of the type shown in FIG. 1. More specifically, a chip 12 is mounted on a paddle 13, and wirebonds 15 connect terminals on the chip to particular ones of the conductive fingers 11.

In the electronic memory industry, in order to increase the density of a memory module some manufacturers, as shown in FIG. 2, have interleaved N substantially identical memory chips 20.N (N=1, 2, 3 . . . ) with spacers 22 to form a vertical stack 30, which is then mounted on the paddle 13 of a lead frame 10. Wirebonds 40.N are connected between terminals on the chips and conductive fingers 50.N on the lead frame. (For simplicity only a portion of each conductive finger is depicted, and only a few of the many connections between the chips and the fingers is shown.)

Our analysis indicates that the prior art stacked memory module design is acceptable only at relatively low frequencies of operation where the transistors within the chips are the limiting factor as to access times, not the inductance external to the chips. At higher frequencies of operation, corresponding, for example, to clock frequencies above about 500 MHz, an undesirable effect known as skew results; that is, when a multiplicity of memory cells is simultaneously addressed by signals that propagate over the wirebonds, longer wirebonds such as 40.N connected to the chip at the top of the stack produce longer access times than shorter wirebonds such as 40.1, 40.2 or 40.3. More specifically, the longer wirebonds have higher self-inductance, which in turn produces higher reactive impedance than that of shorter wirebonds. At high frequencies the wirebond impedance becomes significant relative to the impedance of the CMOS logic circuitry that is typically located at the input of the memory chips, whereas at lower frequencies the wirebond impedance is so small that any skew that does result is inconsequential.

An example will be instructive. In one prior art design of the type shown in FIG. 2, nine 4 Mb memory chips are stacked to produce a module having a density of 36 Mb. Let us assume that the wirebonds have a typical elongated, circular cylindrical shape, are 1 mil in diameter, and are made of Au, which means they would have a self-inductance of 0.14 nH/mil of length in free space. Since the longest wirebond is about 1.4 mm (55 mils) long, it would have a self-inductance of 772 pH, whereas the shortest wirebond being about 0.64 mm (25 mils) long would have a self-inductance of only 350 pH. The corresponding inductive reactance at 1 GHz of the longest wirebond would be about 4.8 Ω and of the shortest wirebond would be about 2.2 Ω. (Thus, the longer wirebond has a reactance that is about 100% larger than that of the shorter wirebond.) The transmission delay through these diverging lengths of wirebond is likewise longer in the longer wirebonds than in the shorter ones. For example, we can estimate the skew as follows. We first assume the speed of signal propagation to be $c=3\times10^8$ M/s. [There is no need to adjust the propagation speed for the various parameters of the wirebond (e.g., physical properties, dielectric strength) since we also assume they are common to all wirebonds.] Then, the difference in propagation delay between the longest and shortest wires (i.e., the skew) is given by $(L_{longest}-L_{shortest})/c$, where L is the length of the wirebond in meters. Using the lengths of 1.4 mm and 0.64 mm above, we estimate the skew to be about 2.5 ps, which is significant at 1 GHz. In contrast, at much lower frequencies the reactance of the wirebonds is not sufficiently large to cause significant skew.

BRIEF SUMMARY OF THE INVENTION

In accordance with one aspect of our invention, a multi-chip electronic module comprises a multiplicity of IC chips arranged in a vertical stack. Each chip includes at least one first electrical terminal, with the first terminals being disposed at different heights relative to the stack. A multiplicity of second electrical terminals is disposed on a support member, and a multiplicity of first electrical conductors is connected between at least a first subset of the first terminals and at least a second subset of the second terminals. In order to reduce the skew produced at relatively high frequencies, all of the first conductors have substantially the same reactive (i.e., inductive) impedance at the frequency of operation of the module. Our invention is particularly well suited to modules that operate at frequencies of about 500 MHz or higher.

In a preferred embodiment, all of the first conductors are cylindrical wirebonds that have substantially the same cross-sectional area and the same length.

BRIEF DESCRIPTION OF THE SEVERAL VIEWS OF THE DRAWING

Our invention, together with its various features and advantages, can be readily understood from the following more detailed description taken in conjunction with the accompanying drawing, in which.

DETAILED DESCRIPTION OF THE INVENTION

Figure 1:
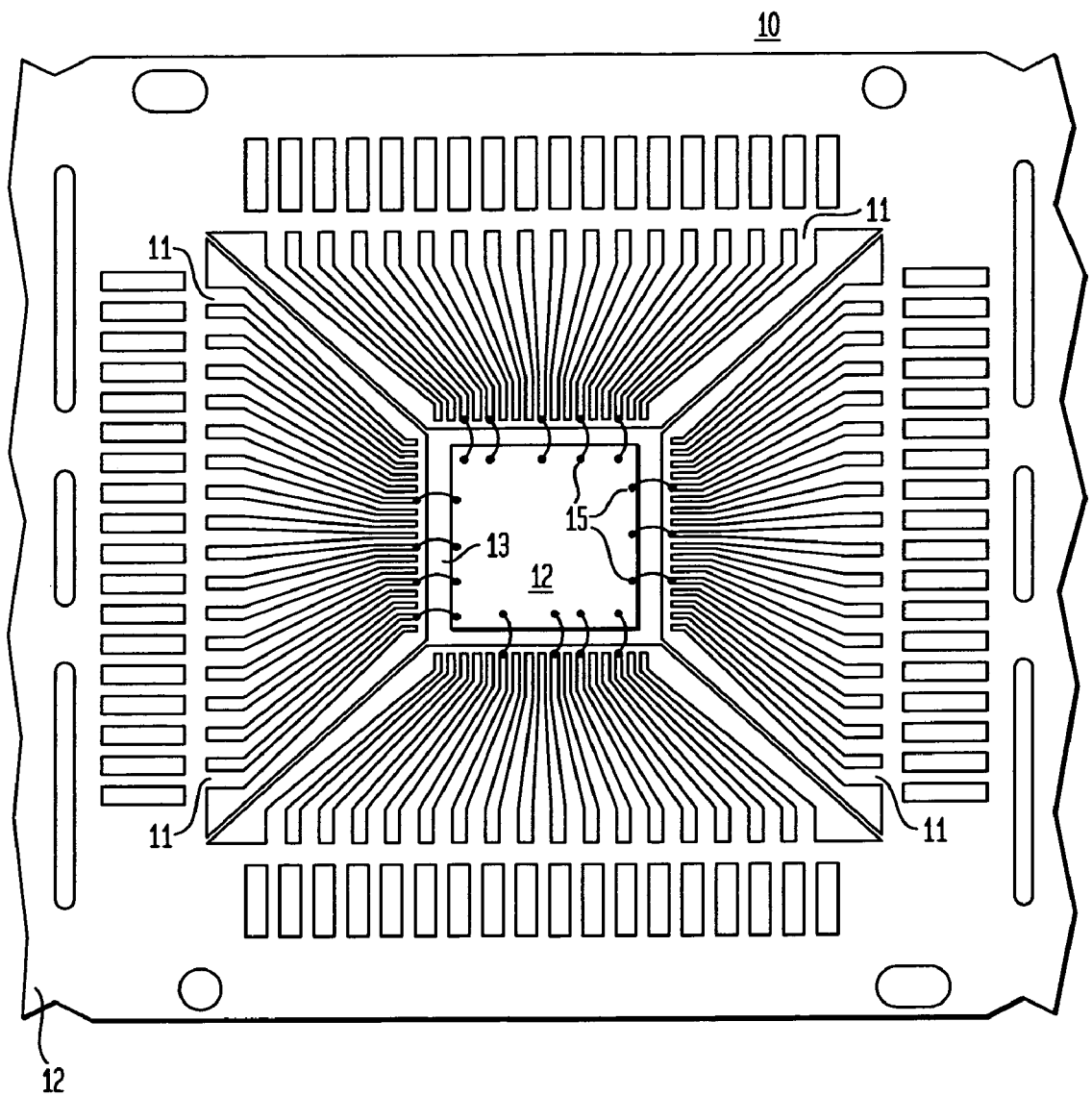
FIG. 1 is a schematic, top view of an IC chip mounted on a prior art lead frame.
Figure 2:
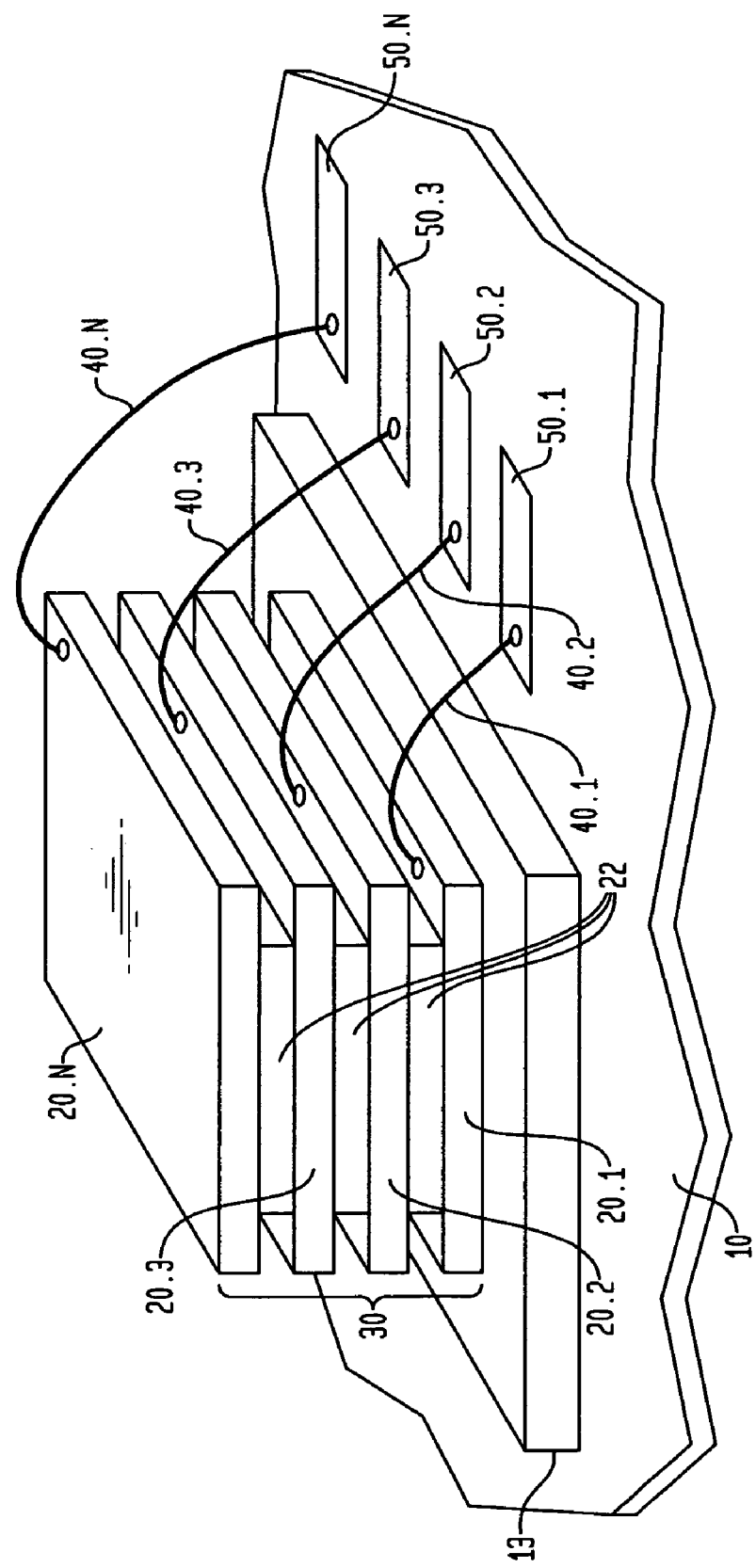
FIG. 2 is a schematic, isometric view of a prior art stacked multi-chip module for operation at relatively low frequencies.
Figure 3:
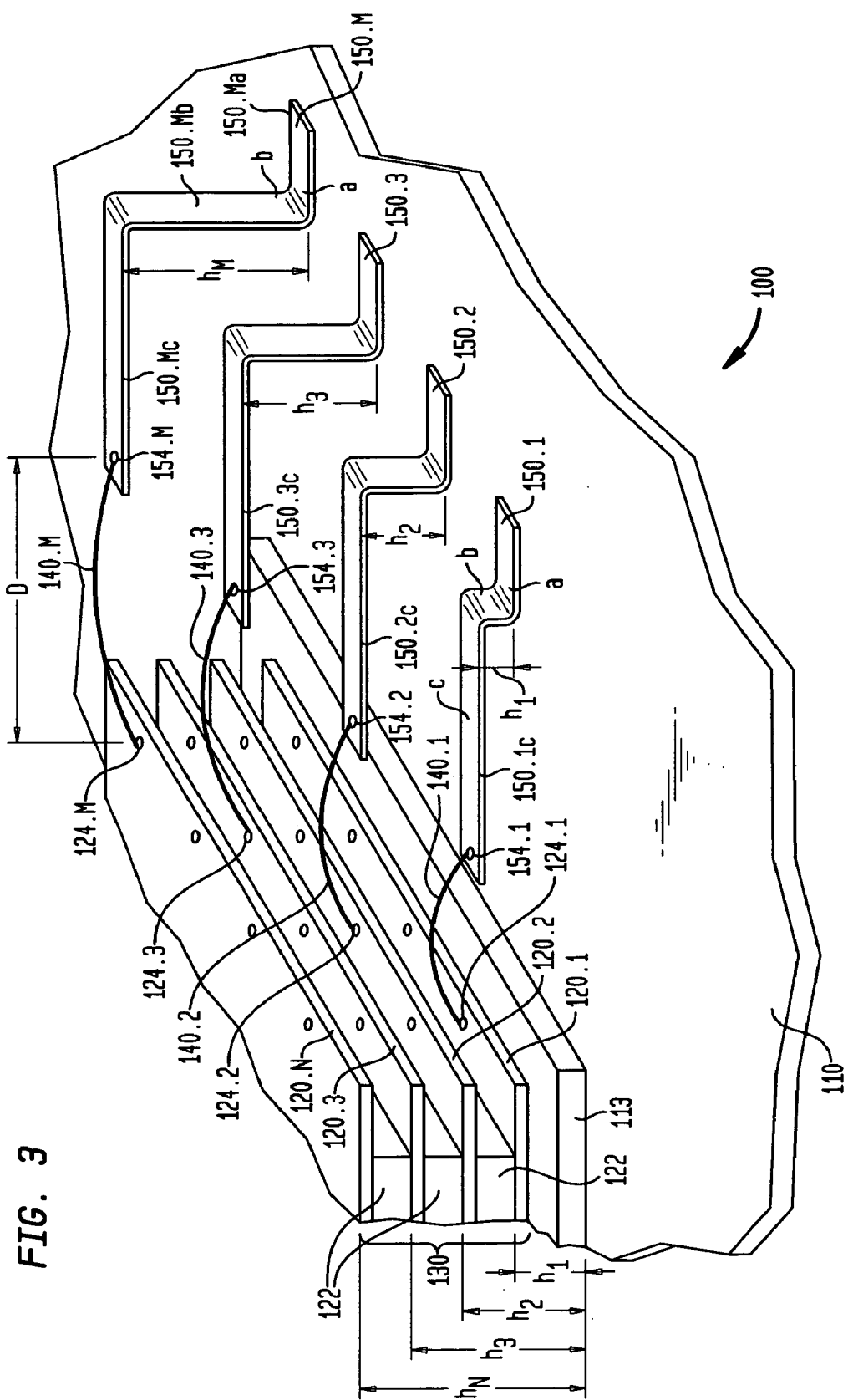
FIG. 3 is a schematic, isometric view of a stacked multi-chip module for operation at relatively high frequencies in accordance with one embodiment of our invention.

Turning now to FIG. 3, we show a multi-chip electronic module 100 for operation at relatively high frequencies, illustratively at 500 MHz or higher. Module 100 includes a multiplicity N of integrated circuit chips 120.N (N=1, 2, 3 . . . ) interleaved with a plurality of spacers 122 to form a vertical stack 130. The stack includes a multiplicity M of first electrical terminals 124.M (M=1, 2, 3 . . . ; typically M>>N), with at least one first terminal being located on each of the chips. For simplicity only four such terminals are shown along one edge of the chips, it being understood that terminals are typically located along other edges as well, and along any particular edge there are typically many terminals. Significantly, however, in at least a first subset of the first terminals, the terminals are disposed at different heights relative to the stack. Thus, for example, in FIG. 3 terminal 124.M is highest being disposed on the top chip 120.N, whereas the terminal 124.1 is lowest being disposed on the bottom chip 120.1.

The module also includes a support member 110 (e.g., lead frame, or circuit board) and a multiplicity of at least M second electrical terminals 154.M. supported by the member 110. Illustratively, at least a second subset of the second terminals 54.M is disposed on elongated, flat first conductors 150.M, which are mounted on the support member. In an illustrative embodiment, each conductor 150.M in the second subset includes a horizontal first segment 150.Ma, which is disposed on the support member 110, a vertical second segment 150.Mb that extends upwardly from the second segment, and an essentially horizontal third segment 150.Mc that is cantilevered from the second segment. The various segments are configured so that the terminals 154.M, which are illustratively located near the ends of the third segments, are disposed at different heights corresponding the heights $h_N$ of the terminals 124.M in the stack 130 and so that the distance between corresponding pairs of terminals 124.M, 154.M is essentially the same. Thus, terminal 124.1 is at essentially the same height $h_1$ as terminal 154.1, and in general terminal 124.M is at essentially the same height $h_N$ as terminal 154.M. In addition, the distances D between corresponding pairs of terminals 124.M and 154.M (M=1, 2, 3 . . . ) are essentially the same.

Making the distances D essentially equal enables us to connect each pair of terminals 124.M, 154.M with elongated electrical second conductors 140.M, typically circular cylindrical wirebonds of essentially equal length, the same cross-sectional area, and the same material (e.g., Au or Au alloy). Consequently, the inductive reactances of the wirebonds are essentially equal, thereby alleviating the adverse effects of skew, or at least making skew insignificant at the operating frequency of the module. Note, the significant reduction of skew realized by this approach is not undermined by the different lengths of the first conductors 150.M because they have relatively large cross-sectional areas, which means that they contribute an insignificant amount of inductive impedance to the module.

Equal length wirebonds also have the advantage that they simplify and make more repeatable the wirebonding process; that is, the bonding head travel or "throw" is essentially constant.

It is to be understood that the above-described arrangements are merely illustrative of the many possible specific embodiments that can be devised to represent application of the principles of the invention. Numerous and varied other arrangements can be devised in accordance with these principles by those skilled in the art without departing from the spirit and scope of the invention. In particular, our invention is applicable to myriad package designs, including, for example, lead frame packages, DIPs (dual in-line packages), QUAD flat packs, BGAs (ball grid arrays), and many others such as those listed and/or illustrated in Leroys Engineering Website: IC Pack Types. This website can found at the following URL:

http://www.interfacebus.com/Design Pack types.html, which is incorporated herein by reference.

For example, in the case of a lead frame package, the stack 130 would be mounted on a paddle 113, the support member 110 would be the lead frame itself, and the second conductors 150.M would be the conductive fingers of the lead frame but preformed so that the terminals pairs 124.M, 154.M are positioned as described above.

On the other hand, in the case of a BGA, the module would illustratively include an upper BGA layer disposed on a lower BGA layer in a step-like configuration that exposes a portion of the upper surface of the lower BGA layer. Upper vias couple the two BGA layers to one another, and lower vias couple to conductive balls on the bottom of the lower BGA layer. The stack 130 would illustratively be disposed on the top surface of the upper BGA layer, but the second terminals 154.M could be disposed on either the top surface of the upper BGA layer, the top surface of the exposed portion of the top surface of the lower BGA layer, or on both.

In addition, although the IC chips 120.N are typically memory chips, the principles of our invention are applicable to any kind of IC chip, such as, for example, multiple radio or microwave frequency ICs within a single package, multiple SERDES (serializer-deserializer) ICs within a single package, or other multiple LSI data transmission ICs (e.g., CPUs) within a single package.

I claim:

1. An electronic module for operation at a particular frequency, said module comprising:
    a multiplicity of integrated circuit chips arranged in a vertical stack,
    a multiplicity of first electrical terminals, at least one of said terminals being located on each of said chips, at least a first subset of said first terminals being disposed at different heights relative to said stack,
    a support member,
    a multiplicity of second electrical terminals mounted on said support member, and
    a multiplicity of first electrical conductors connected between at least a second subset of said second terminals and said first subset of first terminals, characterized in that
    said first conductors all have substantially the same inductive impedance at said frequency.

2. The module of claim 1, wherein said first conductors all have substantially the same cross-sectional area and the same length.

3. The module of claim 2, wherein said first conductors are cylindrical wirebonds.

4. The module of claim 3, further including a multiplicity of second electrical conductors, each of said second conductors having a flat, elongated configuration including a lower segment disposed on a plane corresponding to the bottom of said stack and an upper segment, said upper segments being disposed at heights corresponding to the heights of different ones of said chips in said stack, said second terminals being disposed on said upper segments.

5. The module of claim 1, wherein said support member comprises a circuit board.

6. The module of claim 5, wherein said circuit board includes a lead frame and a paddle disposed in said frame, said stack being mounted on said paddle.

7. The module of claim 1, wherein said chips comprise memory chips.

8. The module of claim 1, further including a clock, and wherein said clock operates at frequency of at least 500 MHz.

9. A multi-chip electronic memory module for operation at a clock frequency of at least 500 MHz, said module comprising:
    a lead frame including a paddle,
    a multiplicity of memory chips,
    a multiplicity of spacers interleaved with said chips to form a vertical stack,
    said stack being mounted on said paddle,
    a multiplicity of first electronic terminals, each of said chips having at least one of said first terminals, at least a first subset of said first terminals being disposed at different heights relative to said paddle, a multiplicity of second electronic terminals disposed on said lead frame, and a multiplicity of wirebonds, each of said wirebonds being connected between a pair of said first subset of first terminals and at least a second subset of second terminals, characterized in that said wirebonds all have substantially the same cross-section and the same length.

10. The module of claim 9, further including a multiplicity of electrical conductors, each of said conductors having a flat, elongated configuration including a lower segment disposed on a plane corresponding to the bottom of said stack and an upper segment, said upper segments being disposed at heights corresponding to the heights of different ones of said chips in said stack, said second terminals being disposed on said upper segments.

11. An electronic circuit for operation at a particular frequency comprising a multiplicity of first electrical terminals, at least a first subset of said first terminals being located at different distances relative to a common reference plane, a multiplicity of second electrical terminals, and a multiplicity of electrical conductors connected between said first subset and at least a second subset of said second terminals, characterized in that said first and second subsets are configured so that said conductors all have substantially the same inductive impedance at said frequency.

* * * * *